(12) United States Patent
Fuller et al.

(10) Patent No.: US 8,716,798 B2
(45) Date of Patent: May 6, 2014

(54) METHODOLOGY FOR FABRICATING ISOTROPICALLY RECESSED SOURCE AND DRAIN REGIONS OF CMOS TRANSISTORS

(75) Inventors: Nicholas C Fuller, North Hills, NY (US); Steve Koester, Minneapolis, MN (US); Isaac Lauer, Mahopac, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 12/779,100

(22) Filed: May 13, 2010

(65) Prior Publication Data

US 2011/0278673 A1 Nov. 17, 2011

(51) Int. Cl.
*H01L 27/12* (2006.01)
(52) U.S. Cl.
USPC .......................................... 257/347; 438/702
(58) Field of Classification Search
CPC ................................................ H01L 29/66772
USPC .......................... 257/347, E21.252, E29.273; 438/694–695, 702
See application file for complete search history.

(56) References Cited

U.S. PATENT DOCUMENTS

| | | | |
|---|---|---|---|
| 4,312,113 A | 1/1982 | Calviello | |
| 5,693,970 A | 12/1997 | Ikemasu | |
| 5,751,050 A | 5/1998 | Ishikawa et al. | |
| 5,949,092 A | 9/1999 | Kadosh et al. | |
| 5,989,988 A | 11/1999 | Iinuma et al. | |
| 6,319,784 B1 | 11/2001 | Yu et al. | |
| 6,342,421 B1 | 1/2002 | Mitani et al. | |
| 6,492,218 B1 | 12/2002 | Mineji | |
| 6,720,225 B1 | 4/2004 | Woo et al. | |
| 7,060,539 B2 | 6/2006 | Chidambarrao et al. | |
| 7,132,339 B2 | 11/2006 | Bryant et al. | |
| 7,151,022 B2 * | 12/2006 | Kim | 438/218 |
| 7,176,522 B2 | 2/2007 | Cheng et al. | |
| 7,192,833 B2 | 3/2007 | Kim et al. | |
| 7,348,641 B2 | 3/2008 | Zhu et al. | |
| 7,494,858 B2 | 2/2009 | Bohr et al. | |
| 7,531,423 B2 | 5/2009 | Cheng et al. | |
| 7,642,147 B1 | 1/2010 | Kanakasabapathy | |
| 7,649,232 B2 | 1/2010 | Tamura et al. | |
| 7,696,051 B2 | 4/2010 | Jin et al. | |

(Continued)

OTHER PUBLICATIONS

Office Action—Non-Final for U.S. Appl. No. 12/779,079, filed May 13, 2010; First Named Inventor: Nicholas C. Fuller; Mailing Date: Jan. 19, 2012.

(Continued)

*Primary Examiner* — Shaun Campbell
(74) *Attorney, Agent, or Firm* — Cantor Colburn LLP; Vazken Alexanian

(57) ABSTRACT

A method for fabricating recessed source and recessed drain regions of aggressively scaled CMOS devices. In this method a processing sequence of plasma etch, deposition, followed by plasma etch is used to controllably form recessed regions of the source and the drain in the channel of a thin body, much less than 40 nm, device to enable subsequent epitaxial growth of SiGe, SiC, or other materials, and a consequent increase in the device and ring oscillator performance. A Field Effect Transistor device is also provided, which includes: a buried oxide layer; a silicon layer above the buried oxide layer; an isotropically recessed source region; an isotropically recessed drain region; and a gate stack which includes a gate dielectric, a conductive material, and a spacer.

12 Claims, 3 Drawing Sheets

(56) References Cited

U.S. PATENT DOCUMENTS

| | | |
|---|---|---|
| 8,048,765 B2 | 11/2011 | Chen et al. |
| 8,102,000 B2 | 1/2012 | Krivokapic |
| 8,313,999 B2 | 11/2012 | Cappellani et al. |
| 2001/0031533 A1 | 10/2001 | Nishibe et al. |
| 2002/0031909 A1 | 3/2002 | Cabral, Jr. et al. |
| 2002/0034867 A1 | 3/2002 | Huang et al. |
| 2002/0072206 A1 | 6/2002 | Chen et al. |
| 2002/0098691 A1 | 7/2002 | Sotome |
| 2004/0021172 A1 | 2/2004 | Zheng et al. |
| 2004/0038484 A1 | 2/2004 | Wang et al. |
| 2004/0072446 A1 | 4/2004 | Liu et al. |
| 2004/0173859 A1 | 9/2004 | Hao et al. |
| 2004/0201063 A1 | 10/2004 | Fukuda |
| 2004/0241948 A1 | 12/2004 | Nieh et al. |
| 2005/0095796 A1 | 5/2005 | van Bentum et al. |
| 2005/0112826 A1 | 5/2005 | Chen et al. |
| 2005/0141276 A1 | 6/2005 | Takeuchi et al. |
| 2005/0227424 A1 | 10/2005 | Oh et al. |
| 2006/0046406 A1 | 3/2006 | Chindalore et al. |
| 2006/0084235 A1 | 4/2006 | Barr et al. |
| 2006/0154461 A1 | 7/2006 | Zhu et al. |
| 2006/0237791 A1* | 10/2006 | Doris et al. .................... 257/348 |
| 2007/0134859 A1 | 6/2007 | Curello et al. |
| 2007/0296002 A1 | 12/2007 | Liang et al. |
| 2008/0121931 A1 | 5/2008 | Chen et al. |
| 2008/0132049 A1 | 6/2008 | Kim et al. |
| 2008/0142886 A1 | 6/2008 | Liao et al. |
| 2008/0185636 A1 | 8/2008 | Luo et al. |
| 2008/0217686 A1 | 9/2008 | Majumdar et al. |
| 2008/0296676 A1* | 12/2008 | Cai et al. ...................... 257/335 |
| 2009/0039426 A1 | 2/2009 | Cartier et al. |
| 2009/0121258 A1 | 5/2009 | Kumar |
| 2009/0146181 A1 | 6/2009 | Lai et al. |
| 2009/0179236 A1 | 7/2009 | Chakravarthi et al. |
| 2009/0191684 A1 | 7/2009 | Shue et al. |
| 2009/0256206 A1 | 10/2009 | Krivokapic |
| 2009/0289379 A1 | 11/2009 | Han et al. |
| 2009/0309158 A1 | 12/2009 | Lin et al. |
| 2009/0311836 A1 | 12/2009 | Cartier et al. |
| 2010/0072550 A1 | 3/2010 | Matsuo |
| 2010/0105199 A1 | 4/2010 | Yasui et al. |
| 2010/0151648 A1 | 6/2010 | Yu et al. |
| 2010/0187578 A1 | 7/2010 | Faltermeier et al. |
| 2010/0187579 A1 | 7/2010 | Arnold et al. |
| 2010/0193847 A1 | 8/2010 | Jiang et al. |
| 2010/0219474 A1* | 9/2010 | Kronholz et al. .............. 257/347 |
| 2010/0291746 A1 | 11/2010 | Yoo et al. |
| 2011/0042745 A1 | 2/2011 | Negoro |
| 2011/0169064 A1 | 7/2011 | Chou et al. |
| 2011/0171792 A1 | 7/2011 | Chang et al. |
| 2012/0305928 A1 | 12/2012 | Fuller et al. |

OTHER PUBLICATIONS

Office Action—Non-Final for U.S. Appl. No. 12/779,087, filed May 13, 2010; First Named Inventor: Nicholas C. Fuller; Mailing Date: Apr. 10, 2012.

Office Action—Restriction-Election for U.S. Appl. No. 12/779,079, filed May 13, 2010; First Named Inventor: Nicholas C. Fuller; Mailing Date: Jul. 16, 2012.

U.S. Appl. No. 13/565,035; Non-Final Office Action; Date Filed: Aug. 2, 2012; Date Mailed: Dec. 28, 2012; pp. 1-15.

Office Action—Final for U.S. Appl. No. 12/779,079, filed May 13, 2010; First Named Inventor: Nicholas C. Fuller; Mailing Date: Oct. 25, 2012, pp. 1-15.

U.S. Appl. No. 12/779,079; Final Office Action; Date Filed: May 13, 2010; Date Mailed: Nov. 21, 2013; pp. 1-21.

U.S. Appl. No. 12/779,079; Non-Final Office Action; Date Filed: May 13, 2010; Date Mailed: Jun. 18, 2013; pp. 1-22.

U.S. Appl. No. 13/565,035; Final Office Action; Date Filed: Aug. 2, 2012; Date Mailed: Jun. 18, 2013; pp. 1-11.

U.S. Appl. No. 13/757,932; Non-Final Office Action; Date Filed: Feb. 4, 2013; Date Mailed: Jun. 28, 2013; pp. 1-27.

U.S. Appl. No. 13/757,932; Final Office Action; Date Filed: Feb. 4, 2013; Date Mailed: Oct. 11, 2013; pp. 1-11.

U.S. Appl. No. 13/565,035; Non-Final Office Action; Date Filed: Aug. 2, 2012; Date Mailed: Oct. 21, 2013; pp. 1-15.

* cited by examiner

METHODOLOGY FOR FABRICATING ISOTROPICALLY RECESSED SOURCE AND DRAIN REGIONS OF CMOS TRANSISTORS

This invention was made with Government support under FA8650-08-C-7806 awarded by the Defense Advanced Research Projects Agency (DARPA). The Government may have certain rights to this invention.

CROSS REFERENCE TO RELATED APPLICATIONS

This application is related to co-pending application Ser. No. 12/779,079, filed May 13, 2010, entitled "METHODOLOGY FOR FABRICATING ISOTROPICALLY RECESSED SOURCE REGIONS OF CMOS TRANSISTORS" and co-pending application Ser. No. 12/779,087, May 13, 2010, entitled "METHODOLOGY FOR FABRICATING ISOTROPICALLY RECESSED DRAIN REGIONS OF CMOS TRANSISTORS" the entire contents of each of which are incorporated herein by reference.

BACKGROUND OF THE INVENTION

1. Field of the Invention

The present invention generally relates to integrated circuits (ICs), and more particularly to CMOS, NFET and PFET devices.

2. Description of Related Art

Generally, semiconductor devices include a plurality of circuits which form an integrated circuit including chips, thin film packages and printed circuit boards. Integrated circuits can be useful for computers and electronic equipment and can contain millions of transistors and other circuit elements that are fabricated on a single silicon crystal substrate.

SUMMARY OF THE INVENTION

According to an aspect of the present invention, a method of forming a Field Effect Transistor (FET) device having a source and a drain region adjacent and underneath a portion of a gate stack which has sidewalls, a top surface, a native oxide layer over the sidewalls and top surface, and is disposed over a silicon containing region is presented. The device has a gate dielectric layer over the silicon containing region, the sidewalls, and top surface of the gate stack.

The method includes:

forming a dielectric layer over the native oxide layer on the sidewalls and top surface of the gate stack;

forming a first recess adjacent the gate stack, the first recess having sidewalls and a bottom surface through a portion of the silicon containing region;

passivating the bottom surface of the first recess to form a passivating layer;

etching a sidewall of the first recess in the silicon containing region for a predetermined lateral distance underneath the gate stack;

removing the passivating layer in the first recess;

etching the bottom surface of the first recess to a target vertical etch depth;

forming a second recess adjacent the gate stack, the second recess having sidewalls and a bottom surface through a portion of the silicon containing region;

passivating the bottom surface of the second recess to form a passivating layer;

etching a sidewall of the second recess in the silicon containing region for a predetermined lateral distance underneath the gate stack;

removing the passivating layer in the second recess; and etching the bottom surface of the second recess to a target vertical etch depth.

According to another aspect of the invention, a Field Effect Transistor device is provided, which includes: a buried oxide layer; a silicon layer above the buried oxide layer; an isotropically recessed source region; an isotropically recessed drain region; and a gate stack including a gate dielectric, a conductive material, and a spacer.

According to yet another aspect of the invention, a Field Effect Transistor device is provided. The device includes: a source and a drain region adjacent and underneath a portion of a gate stack having sidewalls and a top surface, and over a silicon containing region, the device having a gate dielectric layer over the silicon containing region and a native oxide layer over sidewalls and top surface of the gate stack;

a dielectric layer over the native oxide layer on the sidewalls and top surface of the gate stack;

a first recess adjacent the gate stack, the recess having sidewalls and a bottom surface through a portion of the silicon containing region;

an etched sidewall of the first recess in the silicon containing region at a predetermined lateral distance underneath the gate stack; an etched bottom surface of the recess at a target vertical etch depth;

a second recess adjacent the gate stack, the second recess having sidewalls and a bottom surface through a portion of the silicon containing region;

an etched sidewall of the second recess in the silicon containing region at a predetermined lateral distance underneath the gate stack; and an etched bottom surface of the recess at a target vertical etch depth.

The present invention enables enhanced carrier mobility and high speed integrated circuits and ring oscillators.

BRIEF DESCRIPTION OF THE DRAWINGS

Preferred embodiments of the present disclosure are described below with reference to the drawings, which are described as follows.

DETAILED DESCRIPTION OF THE PREFERRED EMBODIMENTS

As device scaling continues to enable density scaling and lower energy consumption per operation, CMOS devices with low operational voltages, multiple gates, and ultra thin body are being considered and developed.

Such changes would enable improved short channel effect (SCE) and reduced variability of the threshold voltage ($V_t$) for turning on the transistor. Performance enhancing elements previously introduced (eSiGe for PFETs) and targeted for future technology nodes (eSiC for NFETs) would likely still be employed for 22 nm and beyond technologies to enhance device performance.

As device geometries change for such nodes—incorporating multi-gates and reducing the channel thickness (much less than 40 nm) for the aforementioned reasons—the ability to controllably recess the channel during patterning for the fabrication of the source and drain regions of the transistor to enable subsequent eSiGe, eSiC etc is significantly reduced.

This issue is further exacerbated for ultra steep subthreshold-slope devices which operate on the principle of band-to-band tunneling as in the case of a subthreshold slope less than 60 mV/decade and employed bias voltages much less than 1V. In these devices the source or the drain region must be recessed in both horizontal and vertical directions on a thin body, such as less than or equal to 40 nm, channel to enable subsequent growth of SiGe or other relevant material.

Conventional plasma etching processes typically employed for recessing source and drain regions are not suitable at these dimensions, since the channel thickness, for example, SOI, GOI, SGOI, is less than or equal to 40 nm. The intrinsic ion energy with no applied bias power typically found in a low pressure plasma process is less than or equal to 15V. Thus, the controllability of the isotropic etch process used to repeatedly fabricate recessed source and drain regions is significantly reduced. Less reactive gaseous species such as HBr, $Cl_2$, and $BCl_3$ and gas dilution such as via insertion of inert gases such as He, Ar etc can reduce the etch rate and may increase controllability to some degree versus conventional $CHF_3$, $CF_4$, $SF_6$-containing chemistries but still do not produce the required degree of control.

Figure 3:
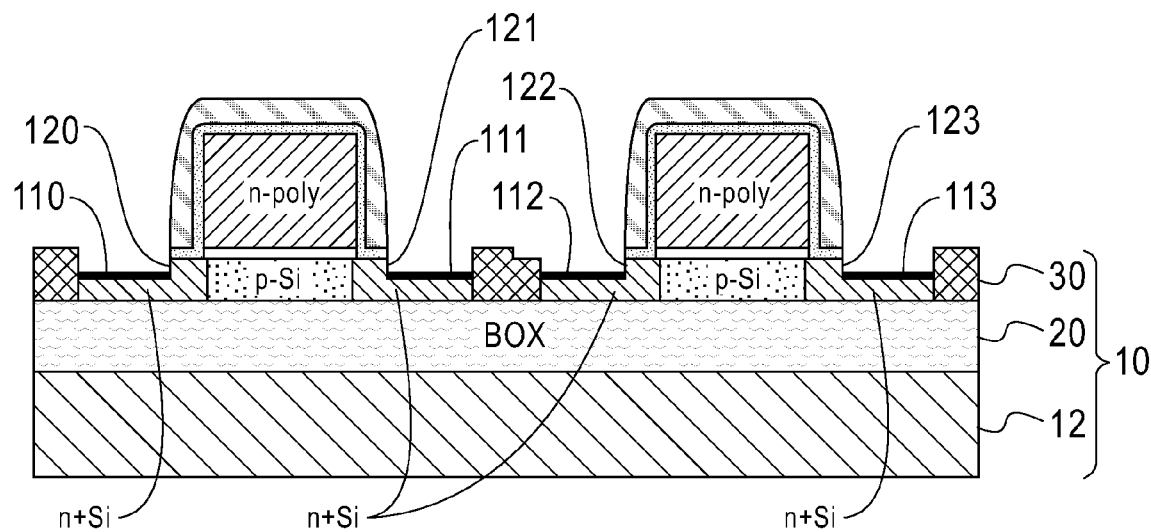
FIG. 3 is a cross section view of a partially fabricated FET device showing a 2nd stage of the inventive processing sequence subsequent to a deposition of a metallic or inorganic material atop the horizontal surface of the recess in the source region and in the drain region.
Figure 4:
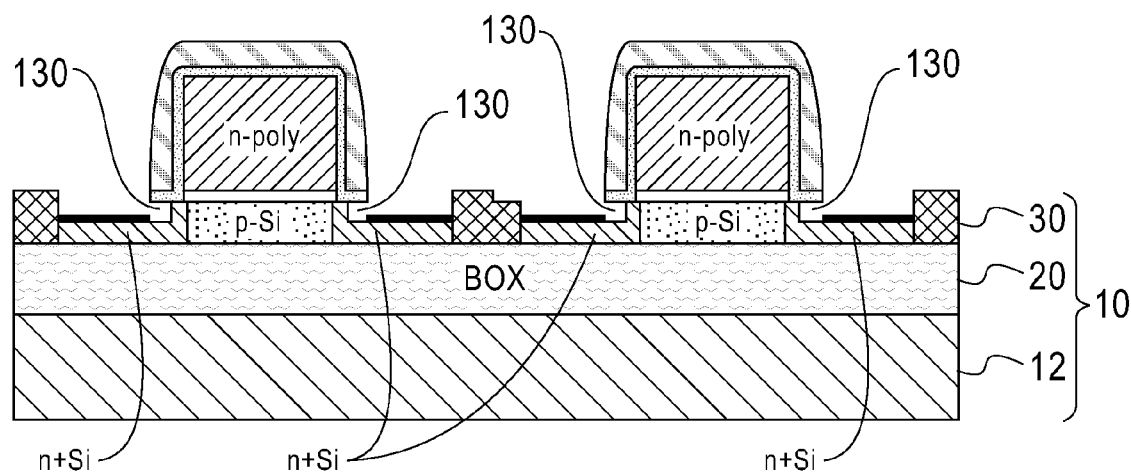
FIG. 4 is a cross section view of a partially fabricated FET device showing a $3^{rd}$ stage of the inventive processing sequence subsequent to a lateral etch of the recess channel to the target distance in the source region and in the drain region.
Figure 5:
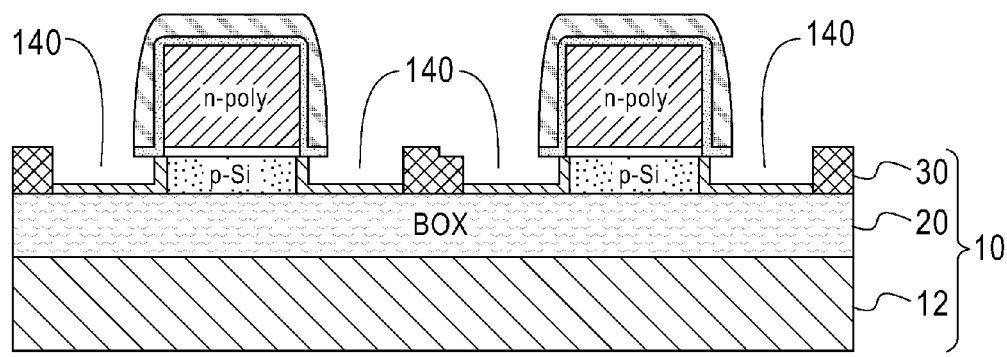
FIG. 5 is a cross section view of a partially fabricated FET device showing a $4^{th}$ stage of the inventive processing sequence subsequent to the removal of the passivating layer and a vertical etch in the recess to the target depth in the source region and in the drain region.

To this end, the use of a sequence of etch and deposition processes as shown in FIGS. 2 through 5 to recess a source and a drain region of a device to the required specification is employed. Without loss of generality, a CMOS device in which the target recess for the source and the drain region for subsequent epitaxial growth of SiGe (pFET), SiC (nFET) is approximately 40 nm whereby each recess extends an equivalent distance beneath the gate as depicted in FIG. 5.

Figure 2:
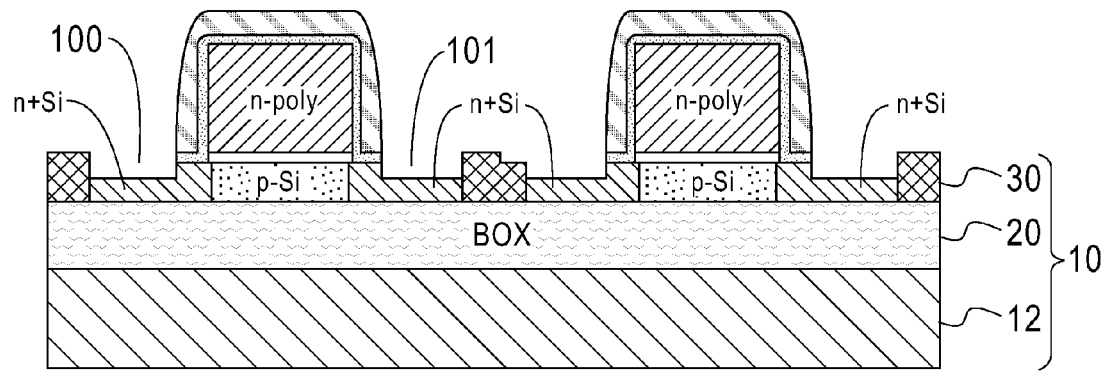
FIG. 2 is a cross section view of a partially fabricated FET device showing a $1^{st}$ stage of the inventive processing sequence with native oxide removal through a "breakthrough" etch process to form a recess in the source region and in the drain region.

The inventive process first employs a known etch process on a typical medium to high density plasma configuration (inductively coupled plasma (ICP), electron cyclotron resonance ECR), dual frequency capacitive (DFC), helicon, or radial line slot antenna (RLSA) with typical plasma conditions, for example, pressure: much less than 10 mT; bias power: 15 W-150 W; source power: less than or equal to 1 kWs; gases: $CF_4$, $CHF_3$, $CH_2F_2$, $CH_3F$, $SF_6$, $Cl_2$, and/or HBr—containing chemistries, to "breakthrough" the native oxide layer and recess a few nm (less than 10 nm) into the channels as shown in FIG. 2.

At this stage of the inventive process, a selective deposition process is employed to passivate the horizontal surfaces as shown in FIG. 3. Such a process can be a physical vapor deposition (PVD) process or another appropriate technique, depositing a few monolayers of a metallic Ti, Ta, TiN, TaN, TiO, TaO, or an inorganic film, such as, $SiO_2$, SiON, $Si_3N_4$, atop only the horizontal channel surfaces leaving the vertical surfaces of the channels exposed.

With the horizontal surfaces passivated, an isotropic etch process, conducted on the same or different platform for that used for the breakthrough process in the first step comprised of $SF_6$, $Cl_2$, HBr, $CH_3F$, $CH_2F_2$, $CHF_3$, and/or $CF_4$-containing chemistries can be applied to laterally etch the channels to the target dimension as in FIG. 4.

Typical conditions applied for such a process include: pressure greater than or equal to 10 mT, bias power equal to 0W, gases as detailed above, and source powers less than or equal to 1 kWs. Since there is no applied bias power, the intrinsic ion energy of this discharge, which is less than or equal to 15V, is less than the energy required to break the bonds in Ti, Ta, TiN, TaN, $SiO_2$, SiON, $Si_3N_4$ etc and so the horizontal surface remains passivated while laterally etching the exposed vertical surface.

Once the lateral etch recess is completed, the passivating layers are removed and the target vertical etch depths are achieved as in FIG. 5. This can be done by use of a known etch process carefully tuned so as to remove the passivating layers and achieve the target depths. Subsequent processing can be conducted to achieve epitaxial growth of the SiGe or other appropriate layer to fabricate the device shown in FIG. 6.

Accordingly, an embodiment of the invention provides an aggressively scaled CMOS device in which the source and drain regions comprised of different materials from that of the employed channel are recessed by a sequence of etch and deposition processes, such as, etch →deposition →etch.

This sequence further provides a CMOS device enabling higher speed circuits and ring oscillators as well as an aggressively scaled CMOS device in which a bias-free, fluorine or fluorine and chlorine-containing etch chemistry is employed to laterally etch the channel selective to the employed spacer and passivating layer of the channel.

This embodiment of the invention further provides an aggressively scaled CMOS device in which the recess of the source and the recess of the drain region is equidistant in both horizontal and vertical directions, that is, much less than 40 nm, as well as an aggressively scaled CMOS device in which a passivating layer comprised of a few monolayers of a metallic, such as, Ti, Ta, TiN, TaN, TiO, TaO, or an inorganic, such as, $SiO_2$, SiON, $Si_3N_4$, film is deposited only onto the horizontal surface of the exposed channel.

There is provided an aggressively scaled CMOS device in which the source and drain regions are recessed by a sequence of etch and deposition processes; facilitating subsequent epitaxial growth of materials in the region different from that of the channel and, thus, enabling faster speed integrated circuits and ring oscillators.

The present embodiment is directed to an aggressively scaled CMOS device in which an inventive processing sequence of etching, deposition, followed up by etching is used to recess source and drain regions of thin body devices, for example, channel thickness less than or equal to 40 nm, in a controllable manner facilitating subsequent growth of alternative materials, such as, eSiGe and eSiC, in these regions, thus enabling enhanced carrier mobility and higher speed integrated circuits and ring oscillators.

To achieve improved short channel effect and reduced $V_t$ variability, thinner body, for example, less than or equal to 40 nm, and multi-gated devices are being considered for 22 nm and beyond technology nodes. The ability to fabricate source and drain regions of materials different from that employed for the channel correlates quite strongly with the ability to controllably recess the channel, such as, SOI, GOI, and SGOI. Thus, for even thinner body devices, extreme control is needed for recessing source and drain regions to enable subsequent formation of the same.

Conventional plasma etching processes used for recessing larger features for larger ground rule devices are incapable of achieving the desired degree of control required for feature sizes at the 22 nm node dimensions and beyond. In contrast, the present invention provides the use of a sequence of etch, deposition, and etching processes to recess/fabricate these source and drain regions of the device.

The 1$^{st}$ stage entails use of a known etching process to breakthrough the native oxide layers of the channel. This is achieved in standard $CF_4$, $CHF_3$, $CH_2F_2$, $CH_3F$, $SF_6$, $Cl_2$, and/or HBr—containing chemistries. This step is followed up by a depositing a few monolayers of a metallic, such as, Ti, Ta, TiN, TaN, TiO, TaO, or an inorganic film, such as, $SiO_2$, SiON, $Si_3N_4$, atop only the horizontal surfaces of the channels. In this way the latter surfaces are protected while exposing the vertical surfaces for subsequent modification.

A lateral etch process is subsequently used to laterally etch the exposed vertical surfaces of the channels to the target distance employing bias free $SF_6$, $Cl_2$, HBr, $CH_3F$, $CH_2F_2$, $CHF_3$, and/or $CF_4$-containing plasma process.

The final step entails removal of the passivating layers and etching the channels in a vertical direction only using an anisotropic etch process, such as, high bias power; $CF_4$, $CHF_3$, $CH_2F_2$, $CH_3F$, $SF_6$, $Cl_2$, and/or HBr—containing plasma.

The recessed region of the source and drain is now ready for subsequent epitaxial growth of SiGe, SiC, or other appropriate layer to enable enhanced device/ring oscillator performance.

Figure 1:
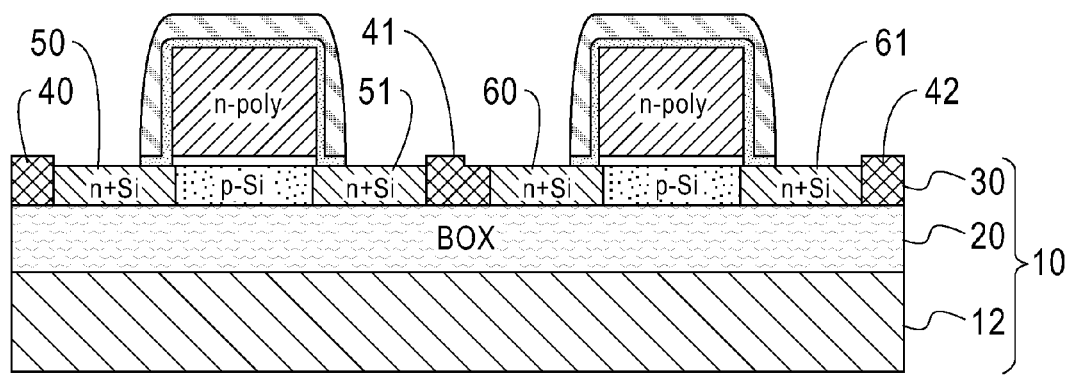
FIG. 1 is a cross section view of a partially fabricated FET device.

Referring to the drawings, FIG. 1 is a cross section view of a partially fabricated FET device with native oxide removed to expose a portion of silicon regions 50, 51, 60 and 61 prior to commencing source and drain recess.

A silicon on insulator substrate 10 including a substrate 12, a buried oxide layer 20 and silicon layer 30 over the buried oxide 20 is shown. Shallow trench isolation regions 40, 41, and 42 are formed in silicon layer 30 to provide isolated silicon regions 50, 51, 60, and 61.

FIG. 2 is a cross section view of a partially fabricated FET device illustrating an etch step. The process employs a prior art etch process on a typical medium to high density plasma configuration with typical plasma conditions. Typical medium to high density plasma configurations can include inductively coupled plasma (ICP), electron cyclotron resonance (ECR), dual frequency capacitive (DFC), Helicon, or Radial Line Slot Antenna (RLSA). Typical plasma conditions can include pressure less than or equal to 10 mT, bias power 15-150 W, source power less than or equal to 1 kWs and F, Br or Cl containing gases to re-breakthrough the native oxide layer. The recesses 100 and 101 are less than 10 nm into the channel.

FIG. 3 is a cross section view of a partially fabricated FET device illustrating passivating layers 110, 111, 112 and 113. Passivating layers 110, 111, 112 and 113 can be formed by a physical vapor deposition (PVD) process or similarly appropriate technique depositing a few layers of a metallic or inorganic film atop only the horizontal. The vertical surfaces 120, 121, 122 and 123 of the channels remain exposed. Examples of a metallic film can include films containing Ti, Ta, TiN, TiO, and TaO. Examples of inorganic films include $SiO_2$, SiON, $Si_3N_4$ FIG. 4 is a cross-sectional view of a partially fabricated FET device illustrating a lateral etch. An isotropic etch process is performed to laterally etch the channel to a target dimension 130. The isotropic etch process can be conducted on the same or different platform as that used for the breakthrough process of FIG. 2.

The etch process can utilize F, Br or Cl containing gases. Typical conditions include pressure greater than or equal to 10 mT, bias power equal to 0W; F, Br or Cl containing gases, and source powers less than or equal to 1 kWs. Since bias power equals 0W, the intrinsic ion energy of this discharge, less than or equal to 15V is much less than the energy required to break the bonds of the passivated horizontal surfaces 110, 111, 112 and 113 in FIG. 3, and therefore the horizontal surface remains passivated while the exposed vertical surface 120 is laterally etched.

FIG. 5 is a cross section view of a partially fabricated FET device illustrating a larger recess formed by a vertical etch step. Passivating layer 110 is removed and the target vertical etch depth 140 is achieved. The etch process to achieve the desired vertical etch depth will be understood by those of ordinary skill in the art.

Figure 6:
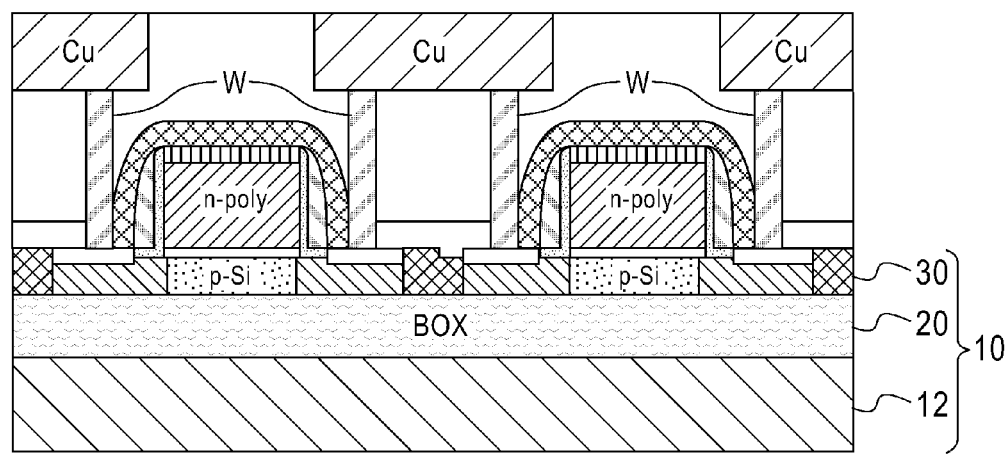
FIG. 6 is a cross section view of an embodiment of the invention showing a fabricated FET device.

FIG. 6 shows an example of a device that can be fabricated by the above method. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. The etch process for the source and the drain regions may be performed simultaneously or sequentially.

We claim:

1. A Field Effect Transistor device, comprising:
a buried oxide layer;
a silicon layer above the buried oxide layer;
an isotropically recessed source and an isotropically recessed drain region, wherein recesses of the source and drain regions are equidistant in both horizontal and vertical directions; and
a gate stack comprising a gate dielectric, a conductive material, and a spacer, the gate stack formed over a channel region having a thickness of less than 40 nanometers (nm).

2. The device of claim 1, further comprising:
an isotropically recessed source and an isotropically recessed drain region adjacent and underneath the gate stack.

3. The device of claim 1, wherein the silicon layer further comprises shallow trench isolation regions to provide isolated silicon regions.

4. The device of claim 1, wherein the silicon layer comprises p or n-doped polysilicon.

5. The device of claim 1, wherein the source and drain region are formed by n+ (or p+) doping the silicon layer.

6. The device of claim 1, wherein the drain region is formed by n+ doping the silicon layer.

7. The device of claim 1, wherein the drain region is formed by p+ doping the silicon layer.

8. The device of claim 1, wherein the gate stack comprises:
   doped polysilicon;
   a conformal layer of native oxide; and
   a layer of silicon nitride or other dielectric over the gate native oxide.

9. The device of claim 1, wherein a portion of the source region further comprises a native oxide layer.

10. The device of claim 1, wherein a portion of the drain region further comprises a native oxide layer.

11. The device of claim 9, wherein a photoresist is formed over portions of the gate stack, a shallow trench isolation region, the drain region, the source region, and the native oxide layer.

12. A Field Effect Transistor (FET) device comprising:
    a source and a drain region adjacent and underneath a portion of a gate stack having sidewalls and a top surface, the gate stack disposed over a silicon containing channel region having a thickness of less than 40 nanometers (nm), the device having a gate dielectric layer over the silicon containing channel region and a native oxide layer over sidewalls and top surface of the gate stack;
    a dielectric layer over the native oxide layer on the sidewalls and top surface of the gate stack;
    a first recess adjacent the gate stack, the first recess having sidewalls and a bottom surface through a portion of the silicon containing channel region;
    an etched sidewall of the first recess in the silicon containing channel region at a predetermined lateral distance underneath the gate stack; an etched bottom surface of the recess at a target vertical etch depth, wherein the predetermined lateral distance and the target vertical etch depth of the first recess are equidistant;
    a second recess adjacent the gate stack, the second recess having sidewalls and a bottom surface through a portion of the silicon containing channel region;
    an etched sidewall of the second recess in the silicon containing channel region at a predetermined lateral distance underneath the gate stack; and an etched bottom surface of the recess at a target vertical etch depth, wherein the predetermined lateral distance and the target vertical etch depth of the second recess are equidistant.

\* \* \* \* \*